(12) United States Patent
Mukund et al.

(10) Patent No.: US 7,849,441 B2
(45) Date of Patent: Dec. 7, 2010

(54) METHOD FOR SPECIFYING STATEFUL, TRANSACTION-ORIENTED SYSTEMS FOR FLEXIBLE MAPPING TO STRUCTURALLY CONFIGURABLE, IN-MEMORY PROCESSING SEMICONDUCTOR DEVICE

(75) Inventors: Shridhar Mukund, San Jose, CA (US); Anjan Mitra, Santa Clara, CA (US); Jed Krohnfeldt, Los Gatos, CA (US); Clement Leung, Fremont, CA (US)

(73) Assignee: iKoa Corporation, Menlo Park, CA (US)

( * ) Notice: Subject to any disclaimer, the term of this patent is extended or adjusted under 35 U.S.C. 154(b) by 857 days.

(21) Appl. No.: 11/426,882

(22) Filed: Jun. 27, 2006

(65) Prior Publication Data

US 2007/0150854 A1    Jun. 28, 2007

Related U.S. Application Data

(60) Provisional application No. 60/694,538, filed on Jun. 27, 2005, provisional application No. 60/694,546, filed on Jun. 27, 2005, provisional application No. 60/694,537, filed on Jun. 27, 2005.

(51) Int. Cl.
*G06F 9/44* (2006.01)
(52) U.S. Cl. ...................................... 717/108
(58) Field of Classification Search ................. 717/114, 717/108, 140; 716/3, 18; 719/224, 317; 713/167; 707/102; 345/441
See application file for complete search history.

*Primary Examiner*—Tuan Anh Vu
(74) *Attorney, Agent, or Firm*—Martine Penilla & Gencarella, LLP

(57) ABSTRACT

A method for specifying stateful, transaction-oriented systems is provided. The method initiates with designating a plurality of primitive FlowModules. The method includes defining at least one FlowGate within each of the plurality of FlowModules, wherein each FlowGate includes a non-interruptible sequence of procedure code, a single point of entry and is invoked by a named concurrent call. An Arc is designated from a calling FlowGate to a called FlowGate and a Signal is generated for each named invocation of the called FlowGate. A Channel is defined for carrying the Signal. Methods for synthesizing a semiconductor device and routing signals in the semiconductor device are provided.

25 Claims, 6 Drawing Sheets

METHOD FOR SPECIFYING STATEFUL, TRANSACTION-ORIENTED SYSTEMS FOR FLEXIBLE MAPPING TO STRUCTURALLY CONFIGURABLE, IN-MEMORY PROCESSING SEMICONDUCTOR DEVICE

CLAIM OF PRIORITY

The present application claims priority under 35 U.S.C. §119(e) from U.S. Provisional Patent Application No. 60/694,538, filed Jun. 27, 2005, U.S. Provisional Patent Application No. 60/694,546, filed Jun. 27, 2005, and U.S. Provisional Patent Application No. 60/694,537, filed Jun. 27, 2005, all of which are incorporated by reference in their entirety for all purposes. The present application is related to U.S. application Ser. No. 11/426,887 entitled APPARATUS FOR PERFORMING COMPUTATIONAL TRANSFORMATIONS AS APPLIED TO IN-MEMORY PROCESSING OF STATEFUL, TRANSACTION ORIENTED SYSTEMS, and U.S. application Ser. No. 11/426,880 entitled STRUCTURALLY FIELD-CONFIGURABLE SEMICONDUCTOR ARRAY FOR IN-MEMORY PROCESSING OF STATEFUL, TRANSACTION-ORIENTED SYSTEMS, each of which are incorporated by reference in their entirety for all purposes.

BACKGROUND

System on a chip (SOC) implementation is predominantly based on design capture at the register-transfer level using design languages such as Verilog and VHDL, followed by logic synthesis of the captured design and placement and routing of the synthesized netlist in physical design. Current efforts to improve design productivity have aimed at design capture at a higher level of abstraction, via more algorithmic/system approaches such as C++, C, SystemC and System Verilog.

As process technology advances, physical design issues such as timing closure and power consumption management have dominated the design cycle time as much as design capture and verification. Methodology advances currently in development and under consideration for adoption using higher levels of abstraction in design capture do not address these physical design issues, and manufacturability issues. It is recognized in the semiconductor industry that with process technologies at 90 nm and below, physical design issues will have even more significant cost impacts in design cycle time and product quality.

CAD tools for placement and route of synthesized logic netlists have delivered limited success in addressing the physical design requirements of deep submicron process technologies. To take full advantage of deep submicron process technology, the semiconductor industry needs a design methodology and a supporting tool suite that can improve productivity through the entire design cycle, from design capture and verification through physical design, while guaranteeing product manufacturability at the same time. It is also well-known in the semiconductor industry that SOC implementations of stateful, transaction-oriented applications depend heavily on on-chip memory bandwidth and capacity for performance and power savings. Placement and routing of a large number of memory modules becomes another major bottleneck in SOC physical design.

Another important requirement for an advanced SOC design methodology for deep submicron process technology is to allow integration of on-chip memory with significant bandwidth and capacity without impacting product development schedule or product manufacturability. High level design capture, product manufacturability, and support for significant memory resources are also motivating factors in the development of processor-in-memory. Processor-in-memory architectures are driven by requirements to support advanced software programming concepts such as virtual memory, global memory, dynamic resource allocation, and dynamic load balancing. The hardware and software complexity and costs of these architectures are justified by the requirement to deliver good performance for a wide range of software applications. Due to these overheads, multiple processor-in-memory chips are required in any practical system to meet realistic performance and capacity requirements, as witnessed by the absence of any system product development incorporating a single processor-in-memory chip package.

There is thus an added requirement for cost effective SOC applications that resource management in processor-in-memory architectures be completely controllable by the designer through program structuring and annotations, and compile-time analysis. It is also important to eliminate all cost and performance overheads in software and hardware complexity attributed to the support of hierarchical memory systems. Based on these observations, there is a need in the semiconductor industry for a cost-effective methodology to implementing SOCs for stateful, transaction-oriented applications.

SUMMARY

Broadly speaking, the present invention fills these needs by providing a method and apparatus for performing in-memory computation for stateful, transaction-oriented applications. It should be appreciated that the present invention can be implemented in numerous ways, including as a process, an apparatus, a system, or a device. Several inventive embodiments of the present invention are described below.

In one embodiment, a method for specifying stateful, transaction-oriented systems is provided. The method initiates with designating a plurality of primitive FlowModules. The method includes defining at least one FlowGate within each of the plurality of FlowModules, wherein each FlowGate includes a non-interuptable sequence of procedure code, a single point of entry and is invoked by a named concurrent call. An Arc is designated from a calling FlowGate to a called FlowGate and a Signal is generated for each named invocation of the called FlowGate. A Channel is defined for carrying the Signal.

In another embodiment, a method for synthesizing a stateful, transaction-oriented system for flexible mapping to a structurally field-configurable semiconductor device having a multi-level array of storage elements, for in-memory processing is provided. The method initiates with mapping FlowLogic to a network of FlowVirtualMachines (FVM). A FlowModule is mapped into a corresponding FlowVirtualMachine (FVM) and one or more FVMs are integrated into an AggregateFVM (AFVM). One or more AFVMs are composed into a FlowTile, and Signals are routed between FlowModules.

In yet another embodiment, a method for routing FlowLogic Signals over a structurally configurable in-memory processing array is provided. The method initiates with configuring a pool of memory resource units into corresponding OutputBuffers, CommuteBuffers and ChannelMemories, the pool of memory units shared with a FlowLogicMachine. A producer-consumer relationship between the corresponding OutputBuffers and CommuteBuffers is configured and a producer-consumer relationship between the CommuteBuffers and VirtualChannels residing in the ChannelMemories is configured. Producer-consumer relationships between the OutputBuffers and VirtualChannels residing in said ChannelMemories are configured and producer-consumer relationships between the CommuteBuffers and neighboring CommuteBuffers are configured.

In still yet another embodiment, a method for debugging a stateful, transaction-oriented runtime system having a multi-level array of storage elements is provided. The method includes instructing the stateful transaction oriented system to pause and instructing the stateful transaction oriented system to single step until a given point. Information for selected FlowGate invocations is tracked and areas within the multi-level array of storage elements are queried for the debugging session.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION

An invention is described for a structurally reconfigurable intelligent memory device for efficient implementation of stateful, transaction-oriented systems in silicon. It will be obvious, however, to one skilled in the art, that the present invention may be practiced without some or all of these specific details. In other instances, well known process operations have not been described in detail in order not to unnecessarily obscure the present invention.

The embodiments of the present invention described below provide a method and apparatus enabling flexible design capture methodology which allows a designer to select the granularity at which a stateful, transaction-oriented application is captured. An efficient methodology to implement a stateful, transaction-oriented application on a platform economically superior with respect to design effort, implementation costs and manufacturability is further described below. The embodiments utilize an execution model that allows for efficient compiler optimization and resource allocation, efficient hardware implementation, and accurate performance analysis and prediction when a design is captured and analyzed. It should be appreciated that no significant uncertainty is introduced by design compilation, mapping into the physical platform, or resource conflicts during system operation. The resource requirements are specified explicitly when the design is captured, using annotations or compiler analysis. Allocation of hardware resources can be determined statically at compile time.

In another aspect of the invention a simple and effective chip architecture that uses a single level real memory organization to eliminate the costs of managing a caching hierarchy associated with virtual memory systems in applications development, compiler optimization, run-time system support, and hardware complexity is provided. As will be explained in more detail below, the embodiments described herein meet the tremendous demands of memory capacity and bandwidth in future generation SOCs with solutions that are economical in die area, product development cycle and power consumption. At the same time, the embodiments reap the cost, performance and power consumption benefits of advanced deep submicron fabrication processes with exceedingly high manufacturability and reliability.

Figure 1:
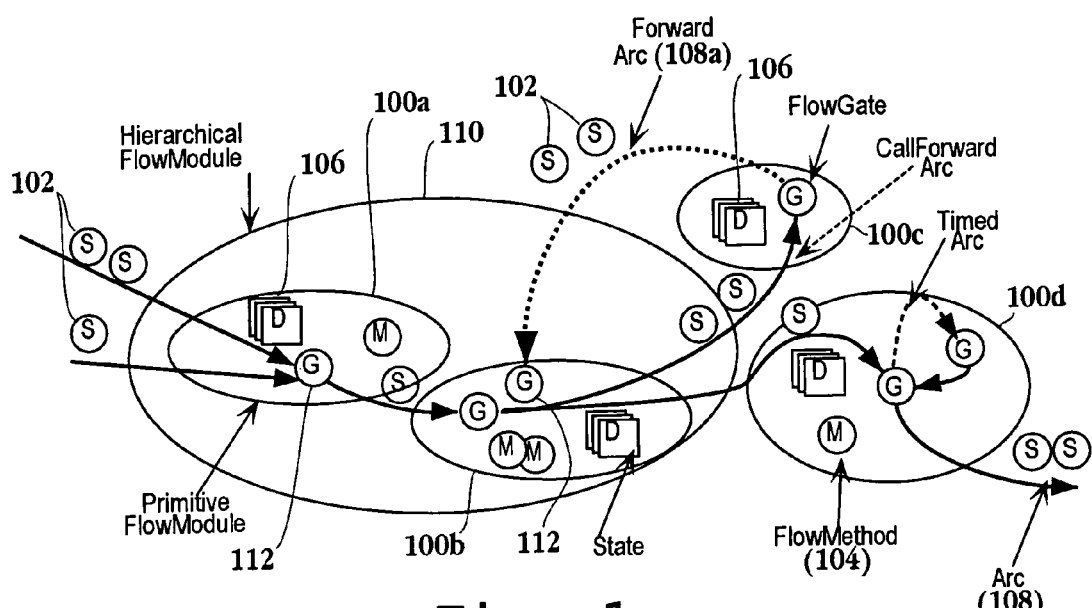
FIG. 1 is a high-level simplified schematic diagram of flow modules in accordance with one embodiment of the invention.

FIG. 1 is a high-level simplified schematic diagram of FlowModules in accordance with one embodiment of the invention. FlowModules 100a through 100d represent objects in accordance with one embodiment of the invention. FlowModules 100a through 100d are mostly comprised of memory arrays in this embodiment. FlowModule 100a includes FlowMethod 104, States 106, and FlowGate 112. Signals 102 are processed and commuted between FlowModules through FlowGates 112. Signals 102, which may be referred to as messages, are in packet format in one embodiment of the invention. The primary inputs and outputs into the FlowLogic architecture are also Signals. Arc 108 represents a channel through which data flows between FlowGates 112. In one embodiment, Arcs 108 represent queues and Signals 102 are transmitted through Arcs 108. FlowModules 100 represent objects, defining codes and data allocated to memory. FIG. 1 further illustrates FlowModule 100a and FlowModule 100b within hierarchical FlowModule 110. FlowModule 100a and FlowModule 100b are grouped within hierarchical FlowModule 110 for convenience in one embodiment. In other words, the grouping of FlowModule 100a and FlowModule 100b may be analogized to an alias. Arcs 108 may be characterized as a ForwardArc 108a, a CallForwardArc 108b or a TimedArc 108c in one embodiment. The details for these types of Arcs are provided below. It should be appreciated that Arcs 108 are created in application-specific fashion. FlowGates 112 are invoked through an external Signal and are akin to a function call.

Still referring to FIG. 1, PrimitiveFlowModules, henceforth referred as FlowModules 100a-d, are concurrent entities that include FlowGates 112, States 106, and FlowMethods 104. Arcs 108 emanate from a FlowGate and terminate at a FlowGate. An Arc can carry one or more Signals at a given time. A FlowGate is invoked by a Signal instance, i.e., a Signal instance is targeted to invoke a specific FlowGate. In one embodiment, a Signal instance is a stream of bytes that carries necessary arguments which may be a small message or a large packet or of any size in between. A Signal also may carry a priority-class attribute. Signals within a class (priority-class) are guaranteed to arrive in the order they were generated at the head of the Arc. It should be appreciated that FlowGate 112 does not have a state of its own. FlowGate 112 can modify the state of the FlowModule it resides in and the FlowGates may generate one or more Signals and thereby invoke one or more FlowGates concurrently. In one embodiment, FlowGate 112 may be thought of as an indivisible and un-interruptible sequence of procedural code that typically terminates after a short burst of execution. FlowLogic guarantees that one and only one FlowGate within a FlowModule is active at any time and a FlowGate once started is guaranteed to complete. FlowMethods, as used herein are sequential bodies of code, e.g., C style function calls that the FlowGates within a FlowModule may use to achieve their end goals. Hierarchical FlowModules comprise one or more FlowModules 100a-d, and are largely used to facilitate FlowLogic code reuse and interface specification exchange. A TimedArc is a special case of an Arc, where the constituent Signals carry a Timer. The constituent Signals in a TimedArc will invoke corresponding FlowGate out-of-order as and when the Timer expires. In one embodiment, TimedArcs are specifically constrained to originate and terminate within the same FlowModule. A ForwardArc is another special case of an Arc 108 whose destination is implied by Signals carried by a CallForwardArc. It should be appreciated that the notion of threads or processors does not exist in the FlowLogic description. FlowLogic can be thought of as a set of interacting pipelines of Signal flows.

One skilled in the art will appreciate from FIG. 1 that the FlowLogic architecture can be used to describe an arbitrary transaction-oriented application using an arbitrary number of interconnected FlowLogic components. Isochronous systems can also be described with reasonable timing resolution. It should be noted that FlowLogic is not meant for traditional digital logic system design where cycle accuracy and deterministic behavior is paramount. Systems designed using FlowLogic are non-deterministic, but can have well-known end-to-end functional behavior independent of the delays in the Arc. Arcs are guaranteed not to drop Signals unless they are attributed specifically to do so. The quantitative or performance behavior of the system may change depending on the parameters of the Arcs, including delay (latency), capacity, priority and so forth.

The FlowLogic architecture allows flexible design space exploration of performance and quantitative behavior, followed by flexible mapping of the results into the said structurally field-configurable semiconductor device. The parameters related to Arcs 108, among others, are determined interactively during system simulations using FlowLogic. It may be noted that the performance behavior of such systems will only be as good as the traffic pattern assumptions made in the simulation. In one embodiment, FlowGates referred to as DynamicFlowGates can be dynamically loaded and linked at run-time. In one embodiment, DynamicFlowGates are limited to serving the purposes of run-time system diagnostics and debug. Thus, an overview of the FlowLogic system and language has been provided above and further details are provided with reference to the Figures referenced below.

Figure 2:
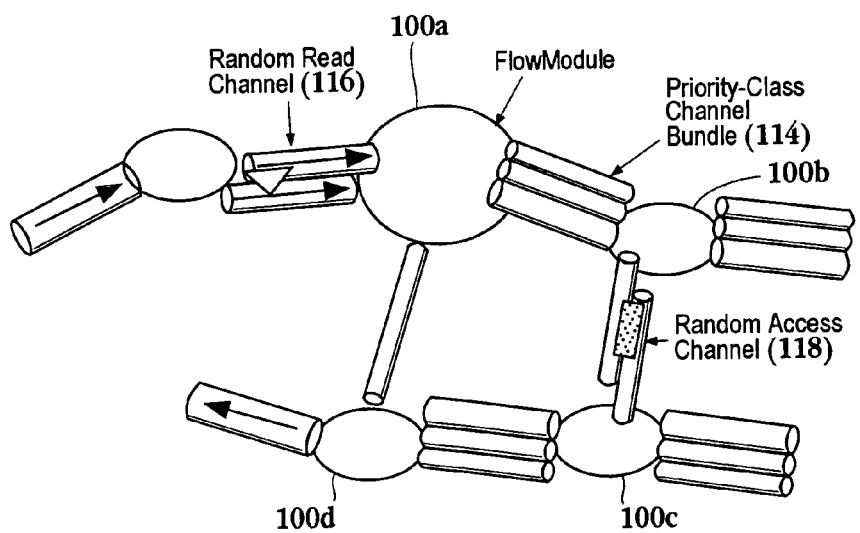
FIG. 2 is a simplified schematic diagram illustrating the data path of a compute element of a tile in accordance with one embodiment of the invention.

FIG. 2 shows an alternative structural view to the FlowLogic system in accordance with one embodiment of the invention. FlowModules 100a through 100d are interconnected through a set of Arcs or Channels. These Arcs or Channels of FIG. 2 may be classified as Random Read Channels 116, Priority Class Channel 114, or Random Access Channel 118, in accordance with one embodiment of the invention. As mentioned above, the FlowModules are mainly composed of memory regions and Channels 114, 116, and 118 provide the wiring for communication between these memory regions. It should be appreciated that different types and capacity channels are inferred interactively from a FlowLogic description via annotations. For example, Signal types carry attributes that determine the range of priority-class, type and capacity of the Channel. A set of Arcs between two FlowModules map into one or more virtual Channels depending on the Signal types that the Arcs carry. A Channel can be thought of as a uni-directional memory element with FlowMethods for producer writes, consumer reads, and synchronization and flow control. In the simplest case, a Channel may be a first-in-first-out (FIFO) serial queue. In another embodiment, a Channel may be serial-write, random-read for the purposes of filtering and classification functions. In yet another embodiment, a Channel may comprise random-write and random-read ability to exchange semaphores.

Figure 3:
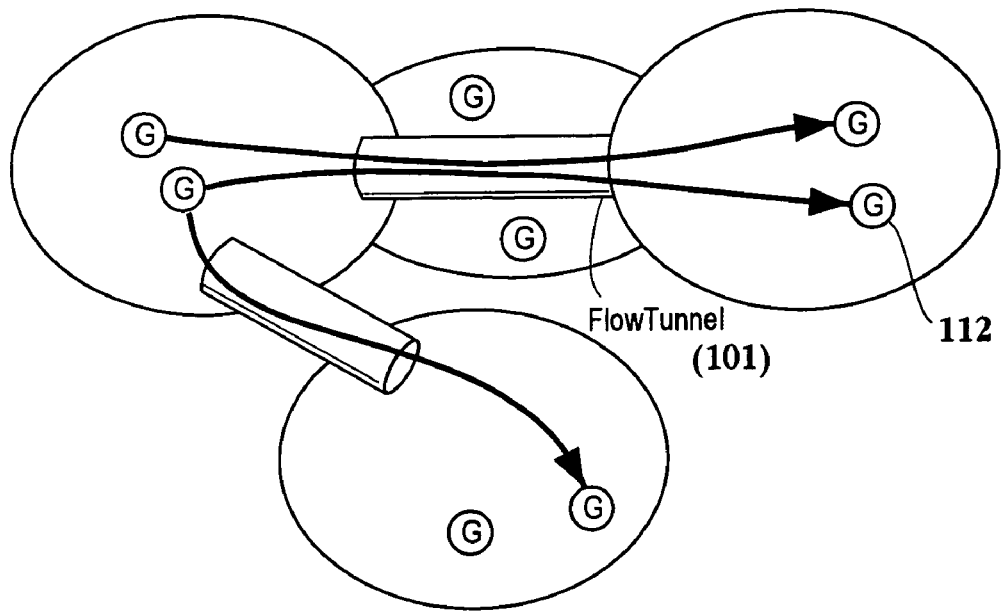
FIG. 3 depicts the notion of FlowTunnels in accordance with one embodiment of the invention.

FIG. 3 depicts the notion of FlowTunnels in accordance with one embodiment of the invention. A FlowTunnel 101 is a FlowLogic sub-design that bridges communications between two clusters of FlowLogic. While FlowLogic clusters are optimized for implementation on semiconductor devices with over-provisioned internal communication paths, FlowTunnels encapsulate relatively lower bandwidth communication paths such as serial interfaces between sub-systems. For example, in the preferred embodiment, one cluster corresponds to the portion of FlowLogic description that is implemented on a host processor. This is connected to another duster which is implemented on an in-memory processing device communicating over a PCI Express link. Also FlowLogic Clusters implemented on separate semiconductor dies and or devices communicate with each other over relatively lower bandwidth FlowTunnels. The functionality of a FlowTunnel comprises of buffering, re-synchronization, coalesing and priority based scheduling.

Figure 4:
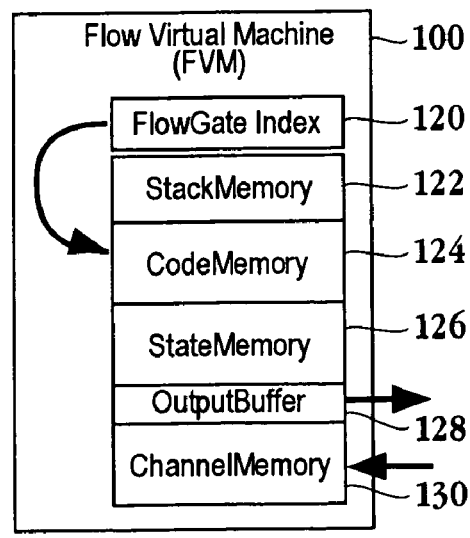
FIG. 4 is a simplified schematic diagram illustrating a logical view for the execution of a FlowModule in accordance with one embodiment of the invention.

FIG. 4 is a simplified schematic diagram illustrating a logical view for the execution of a FlowModule in accordance with one embodiment of the invention. It should be appreciated that the embodiments described herein take an object and translate that into a FlowModule, which is then further translated into a FlowVirtualMachine (FVM). FlowVirtualMachine 100 represents the execution model of a FlowModule. FVM 100 includes FlowGateIndex 120. In one embodiment, a Signal will hit a FlowModule and through the FlowGateIndex it is determined which FlowGate to execute. In one embodiment, the data within the Signal itself will identify the FlowGate to pick up. StackMemory 122, CodeMemory 124, StateMemory 126, OutputBuffer 128, and ChannelMemory 130 are further included in FVM 100. OutputBuffer 128 is a relatively small memory area for temporarily staging outgoing Signals. ChannelMemory 130 is on the input side for receiving messages into FVM 100. It should be appreciated that each portion of the memories within FVM 100 is shared or aggregated by FlowGates with the exception of CodeMemory 124. Thus, when a Signal hits a FlowGate, as mentioned above, there is a pointer to invoke the FlowGate code. It should be appreciated that FIG. 3 depicts a model that directly determines the characteristics required for mapping to a field-configurable semiconductor device. For the purposes of describing the preferred embodiment of this invention, it is sufficient to talk about the architectural aspects of FVM rather than the details of execution. The variable components of a FVM are the memory partitions and their contents, by varying which any FlowModule can be mapped and executed on it.

It should be noted that the sizes of the logical memory partitions in an FVM are arbitrary and the partitions have physically independent access paths. The code related to FlowGates and FlowMethods is compiled into relocatable machine code which in-turn determines the logical size of the corresponding FVM CodeMemory. The FlowGateIndex contains a jump table indexed on unique FlowGate identifier along with the pointer to the FlowGate code, among other context data for proper FlowGate execution. The StackMemory is used for storing intermediate states as required during the FlowGate execution. There are no register files in the FVM. The working of the FVM is analogous to that of a stack machine. The Stack is always empty before a FlowGate starts since the FlowGate by itself does not have a persistent state, and the FlowGate is not allowed to suspend.

The size or the depth of the Stack is determined at compile-time by the FlowLogic compiler. As may be evident, FlowLogic programming style does not support nested calls and recursive function calls whose depths are not predictable at compile-time. Furthermore, there is no dynamic allocation or garbage collection in FlowLogic because memory resource allocations are fixed at compile-time. Other than temporary variables whose life times span the FlowGate call, State variables are all pre-allocated at compile-time. The size of the StateMemory 126 for a FVM is well known at the compile time. OutputBuffer 128 and ChannelMemory 130 are managed by the run-time system and are visible to the system designer only via annotation in one embodiment. OutputBuffer 128 is a small memory area for temporarily staging outgoing Signals. ChannelMemory 130, on the other hand, hosts the Channels and is as large as is required by the corresponding FVM. It is useful to point out at this time that although these memories have different access data paths, the memories all use the same resource types in the structurally configurable in-memory processing array. In fact, memories are the only resources directly allocated in the array, with other necessary logic, including processing elements, being fixed to such memory resources.

Figure 5:
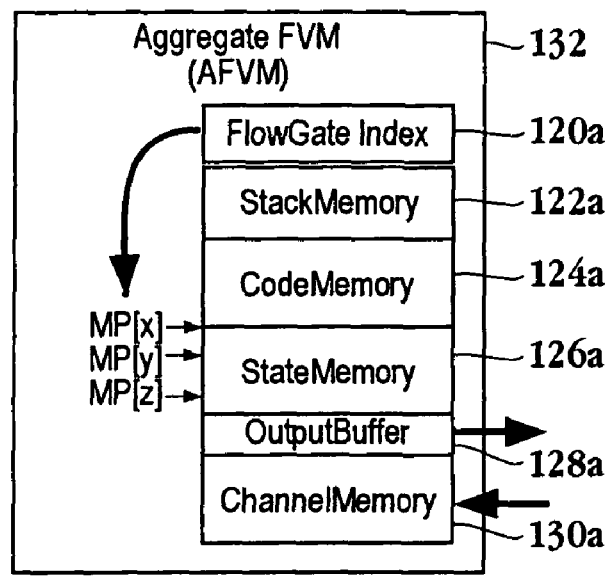
FIG. 5 is a simplified schematic diagram illustrating the ability to aggregate several flow modules into one aggregate structure in accordance with one embodiment of the invention.

FIG. 5 is a simplified schematic diagram illustrating the ability to aggregate several FlowModules into one aggregate structure in accordance with one embodiment of the invention. Here, multiple FVMs are aggregated and placed into what is referred to as a FlowTile. Aggregate FVM 132 includes a similar structural representation as an individual FVM, i.e., FlowGateIndex 120a, StackMemory 122a, CodeMemory 124a, StateMemory 126a, OutputBuffer 128a, and ChannelMemory 130a. Module pointers (MP) x, y, and z are pointers pointing to corresponding StateMemory areas of the aggregated FlowModules. It should be appreciated that FlowGateIndex 120a will now index into the CodeMemory, as well as the StateMemory, since multiple FlowModules have been aggregated together. It should be appreciated that the ability to aggregate several concurrent FlowModules into one aggregate is a distinguishing factor behind the FVM architecture. The StackMemory size is the maximum of the StackMemory sizes of the individual FVMs. CodeMemory 124a is the sum of the code memories of the aggregated FVMs. However, in one embodiment, CodeMemory 124a may be shared among different FlowModules, resulting in a total size that is smaller than the sum. In the particular case, where multiple FlowModules of the same type are replicated for load sharing, CodeMemory 124a may even contain a single code copy shared among multiple instances. OutputBuffer 128a and the ChannelMemory 130a blocks are managed by the run-time system, in a fashion largely transparent to the application.

Figure 6:
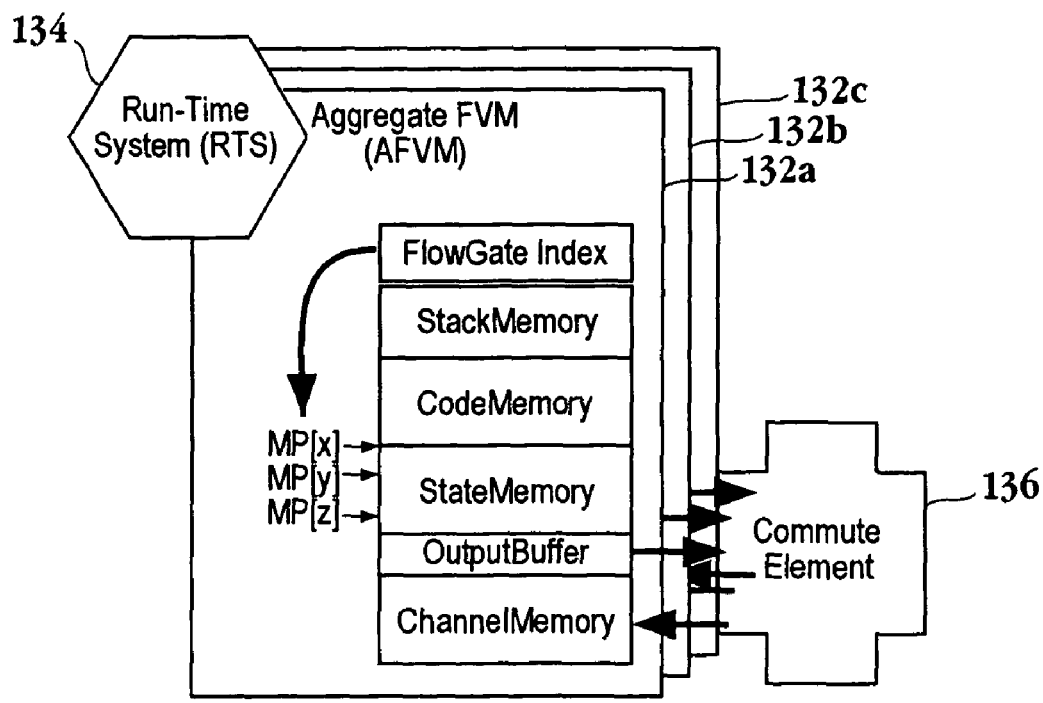
FIG. 6 is a high-level schematic diagram illustrating a tile that supports a corresponding set of virtual processors in accordance with one embodiment of the invention.

FIG. 6 is a high-level schematic diagram illustrating a FlowTile that supports a corresponding set of virtual processors in accordance with one embodiment of the invention. In this representation, the FlowTile is composed of aggregate FVMs 132a, 132b, and 132c. Run-time system 134 functions to determine which Signal is associated with which FlowGate. Thus, run time system 134, which may be referred to as a kernel, will coordinate the flow of Signals within the FlowTile. Commute element 136 functions to move Signals into and out of the FlowTile. In one embodiment, Commute element 136 may be thought of as an interface or a router for the various Signals being transmitted. Of course, the router functionality is illustrated here as being internal to the system, however, the router functionality may alternatively be external to the FlowTile in another embodiment. As shown in FIG. 6, multiple AFVMs are mapped to a FlowTile that supports a corresponding set of virtual processors. A FlowTile is a physical entity that has a certain total number of memory resource units. The sum of the resources required by the AFVMs cannot exceed this total. Within this constraint, memory units can be mapped flexibly to serve the functionality of the constituent FlowModules. A FlowTile has a corresponding Runtime System, which coordinates the flow of Signals within the FlowTile. As mentioned above, the Commute element is responsible for moving Signals out of the OutputBuffer and into the corresponding ChannelMemory.

Figure 7:
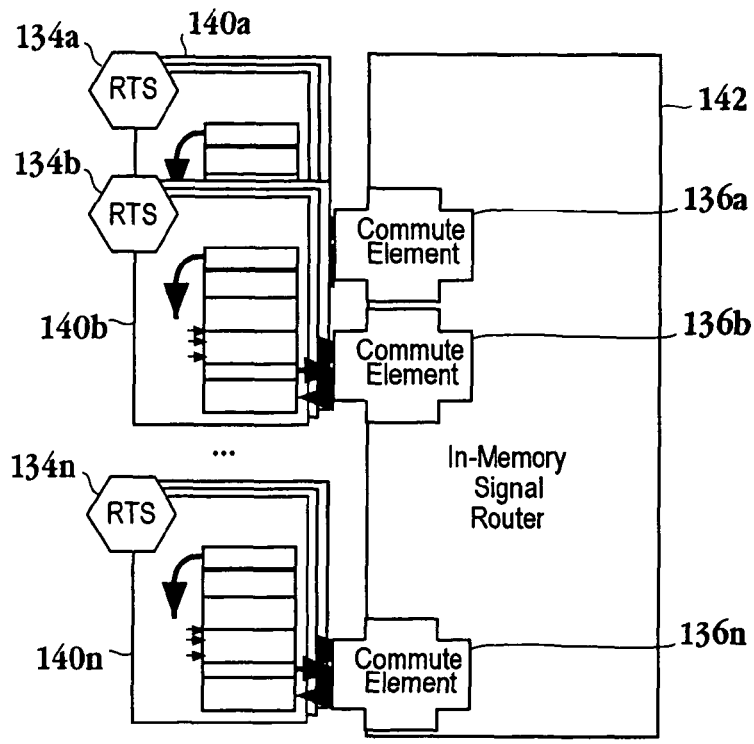
FIG. 7 is a high-level simplified schematic illustrating an architectural view of a FlowLogicMachine in accordance with one embodiment of the invention.

FIG. 7 is a high-level simplified schematic illustrating an architectural view of a FlowLogicMachine in accordance with one embodiment of the invention. Here, each FlowTile 140a through 140n is connected to in-memory Signal router 142 through corresponding commute elements 136a through 136n. It should be appreciated that in-memory Signal router 142 performs routing functionality within the chip that the FlowLogicMachine is designed for. Within each FlowTile 140a through 140n, the coordination of Signals is performed by run-time systems 134a through 134n, respectively. FlowTiles 140a-n are connected to the application independent in-memory router 142 for routing Signals within the FlowLogicMachine. Memory router 142 includes Commute elements 136a-n associated with every FlowTile. In one embodiment, the in-memory router 142 is sufficiently over-provisioned to ensure that Signals flow out of the OutputBuffer and in-memory router 142 without causing blockages, and with minimal transit time. If there is a blockage, the blockage is constrained to the ChannelMemory, where it manifests as a system characteristic, which can be appropriately alleviated at the level of the FlowLogic design representation. As mentioned above the router functionality may also be performed externally. In one embodiment, the run-time system ensures that Signals are created only if the receiving Channel has sufficient credits, ensuring that the worse case behavior of deadlock, over-run etc. does not occur. The overhead of credit based flow control management is tunable at the FlowLogic design representation level by providing adequate Channel sizing attributes. Commute elements 136a-n further breaks up Signals into small flow control digits (Flits) ensuring that end-to-end latency is not sensitive to Signal sizes.

Figure 8:
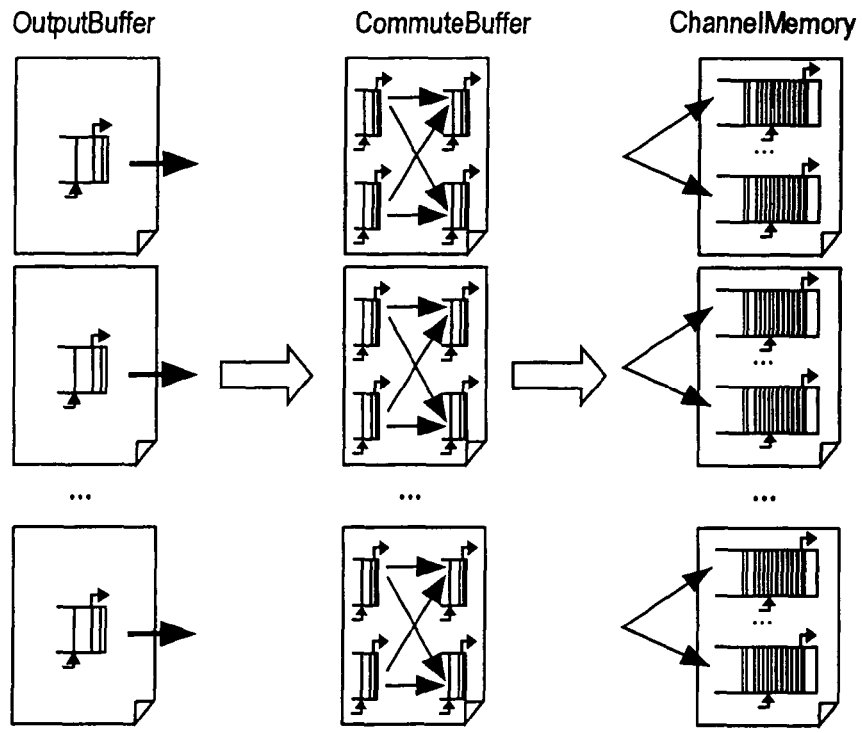
FIG. 8 is a simplified schematic diagram illustrating the data flow within a flow logic machine in accordance with one embodiment of the invention.

FIG. 8 is a simplified schematic diagram illustrating the data flow within a FlowLogicMachine in accordance with one embodiment of the invention. The OutputBuffer for a FlowTile originating a Signal will forward that Signal to the Commute element, where a larger message may be broken up into smaller chunks and passed through intermediate stages.

These smaller chunks are then accumulated in ChannelMemory, which is in a FlowTile consuming the data in one embodiment. Signals from the OutputBuffer are independently read out by the Commute element and segmented into Flits, which are the flow control digits or primitives.

Figure 9:
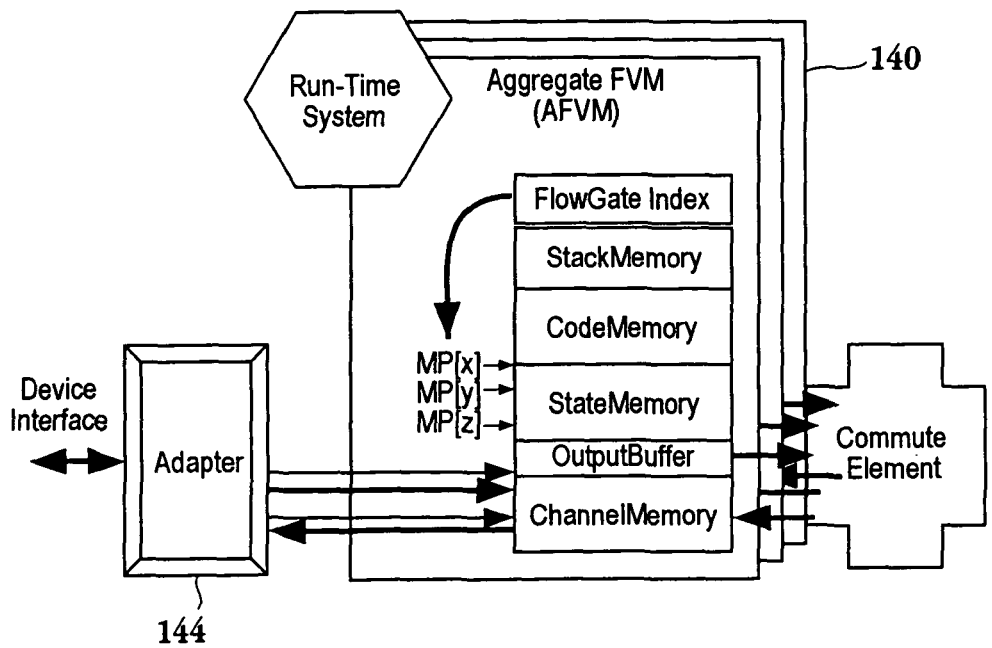
FIG. 9 is a simplified schematic diagram illustrating a Tile having an adapter to interface with an external device to the Tile in accordance with one embodiment of the invention.

FIG. 9 is a simplified schematic diagram illustrating a FlowTile having an Adapter to interface with an external device to the FlowTile. FlowTile 140 is in communication with Adapter 144. Adapter 144 can provide an interface for chip-to-chip communication in accordance with one embodiment. For example, Adapter 144 may provide a packet interface in order to transfer packets between devices. It should be appreciated that the Adapter can be designed so that the interface is application-specific. In one embodiment, some of the FlowTiles, e.g., on the periphery of the array, are configured to interface with the external world, e.g., other chips. The interface for the external world is also a Signal based interface that is accomplished through Adapter 144 as shown in FIG. 9.

The FlowLogicMachine can itself be thought of as an array of structurally configurable memory units that implements a plurality of FlowTiles, where the computational logic is fixed and distributed. As a further analogy, the FlowLogic language described herein may be thought of as the JAVA language, while the FlowLogicMachine may be analogized to the JAVA Virtual machine, since the FlowLogic Language has some attributes of object oriented programming languages. For one skilled in the art, it should be appreciated that much of the resources in question are memory units in one form or another, i.e., code, state, stack, channels, and buffer. Motivated by the above observation, the FlowLogicMachine is designed to provide the ability to configure these memory units, also referred to as memory resources, as required by a particular application and the FlowLogic representation allows the flexibility of re-casting a system description in flexible ways to achieve the targeted capacity, performance, and functionality.

As mentioned above, FIG. 7 shows the architectural view of a FlowLogicMachine. It comprises a plurality of FlowTiles. The FlowTiles are connected to the application independent in-memory router for routing Signals within the FlowLogicMachine. The said router comprises Commute elements associated with every FlowTile. In the preferred embodiment, the router is sufficiently over-provisioned to ensure that Signals flow out of the OutputBuffer and through the router itself without causing blocks, with minimal transit time. If there is a blockage, it is constrained to the Channel Memory, where it manifests as a system characteristic which can be appropriately analyzed and managed at the FlowLogic level of the design representation. The run-time system ensures that Signals are created only if the receiving Channel has sufficient credits, ensuring that the worse case behavior of deadlock, over-run etc. does not occur. The overhead of credit based flow control management is tunable at the FlowLogic design representation level by providing adequate sizing Channel attribute. The Commute element further breaks up Signals into small flow control digits (Flits) ensuring that end-to-end latency is not sensitive to Signal size and the number of hops.

Some of the FlowTiles, say on the periphery of the array, are configured to interface with the external world. The said interface is also a Signal based interface that is accomplished through Adapter as shown in FIG. 9.

The FlowLogicMachine can itself be thought of as an array of structurally configurable memory units that implements a plurality of FlowTiles where the computational logic is fixed and distributed. For one skilled in the art, it is easy to see that much of the said resources in question are memory units in one form or another: code, state, stack, channels, and buffer. Motivated by the above observation, the FlowLogicMachine is designed to provide the ability to configure the memory units as required by a particular application and the FlowLogic representation allows the flexibility of re-casting a system description in flexible ways to achieve the targeted capacity, performance and functionality.

The FlowLogicMachine has novel features that help in system diagnosis among others. FlowGates are by-design atomic and always go to completion, once fired. There is no notion of run-time instruction-level single-stepping in the context of FlowLogicMachine. Instead, it can be stepped on FlowGate boundaries. FlowTiles can be instructed to execute one FlowGate at a time. An external debug controller can observe the StateMemory, ChannelMemory and other partitions of the FVM by making explicit system read calls when the FlowLogicMachine is paused between steps of FlowGate execution. The debug controller may even launch DynamicFlowGates to achieve diagnostic goals. The FlowLogicMachine has built-in FlowGates called SystemFlowGates for read, write and configuration purposes. The SystemFlowGates come into existence on device boot, independent of applications. These SystemFlowGates are also used for booting application-specific FVMs.

The embodiments described herein also support runtime debugging of the FlowLogicMachine. The FlowLogic runtime system can be controlled from an outside machine (host) through sending and receiving of signals with specific debugging payloads. The host sends debugging commands to the runtime system in signals; it also receives data and state information back from the runtime system in signals.

The following debugging techniques are supported by the FlowLogicMachine:

- The runtime system can be instructed to pause (break) execution on a given condition. These conditions may include invocation of a specific FlowGate, the contents of any input signal, any expression on FlowGate invocations (i.e. the $n^{th}$ invocation of a given FlowGate), or any other internal state of the runtime system. Upon halting execution, the runtime system will notify the host by sending a signal indicating that execution has stopped. The host can then control the debugging process by sending further instructions encapsulated in signals.
- The runtime system can be instructed to resume execution (step) until a given condition. This is analogous to single-stepping in a compiled code environment. Several variants of this behavior are supported, such as "step to the next FlowGate invocation", "step to the $n^{th}$ invocation of a given FlowGate", or "step until a FlowGate receives a signal with a given content".
- The runtime system can be instructed to capture information (trace) about selected or all FlowGate invocations and communicate this information to the host. The information communicated is essentially a trace of the firings of FlowGates, their input signals, and their output signals.
- The runtime system can be instructed to query certain memory areas in the tile and return data (dump) to the host system. The information communicated can be the current positions of the context pointers (such as MP), the contents of any memory or a sub-range of that memory, or the current utilization of VirtualChannels.
- To support diagnostics and debugging, executable FlowGate code can be sent from the host to the runtime system of a given FlowTile. The runtime system will load this code into its CodeMemory and execute it to support the debugging session.

One skilled in the art may note that FlowLogic is not a general method for describing any digital system for system-on-chip implementation. Some of its notable distinctions include:
1. It raised the level of abstraction for design capture, verification and analysis. To allow for implementation flexibility, it is not required to preserve cycle accuracy among different levels of design representation.
2. At a higher level of design capture, it is not deemed necessary to support arbitrary combinational logic oriented systems efficiently
3. The performance of the system designed using FlowLogic depends on the mix of workload used in simulation.
4. Functionality and performance of FlowLogic designs are not efficiently implemented on systems that primarily span over bandwidth constrained networks. FlowLogic is optimized for implementation on bandwidth over-provisioned on-chip intelligent memory with Flit based communications.

FlowLogic relies on the assumption that quantitative behavior at the FlowLogic level is perturbed minimally as it is translated to the physical implementation.

The embodiments described above provide a memory centric approach for a processing system design and architecture, as well as the FlowLogic language for designing, synthesizing, and placing and routing techniques for this unique processing system design. Terms of the FlowLogic language have been analogized to some object oriented terms for ease of understanding. For example, a FlowGate may be thought of as a Function, Procedure or Task, while a FlowModule may be analogized to an object in object oriented programming. A Signal may be referred to as a message or a packet. It should be appreciated that while these analogies are used for explanatory purposes, there are significant differences between the embodiments described herein and the corresponding analogies.

Traditional processors incorporate the notion of virtual memories to push physical memory away from the processing core. To do so, they introduce accumulators, registers and caching hierarchies. The embodiments described above embrace the incorporation of processing core(s) directly within the physical memory. Furthermore, the data paths in the above-described embodiments are significantly different than the data paths within the traditional processor architecture.

Figure 10:
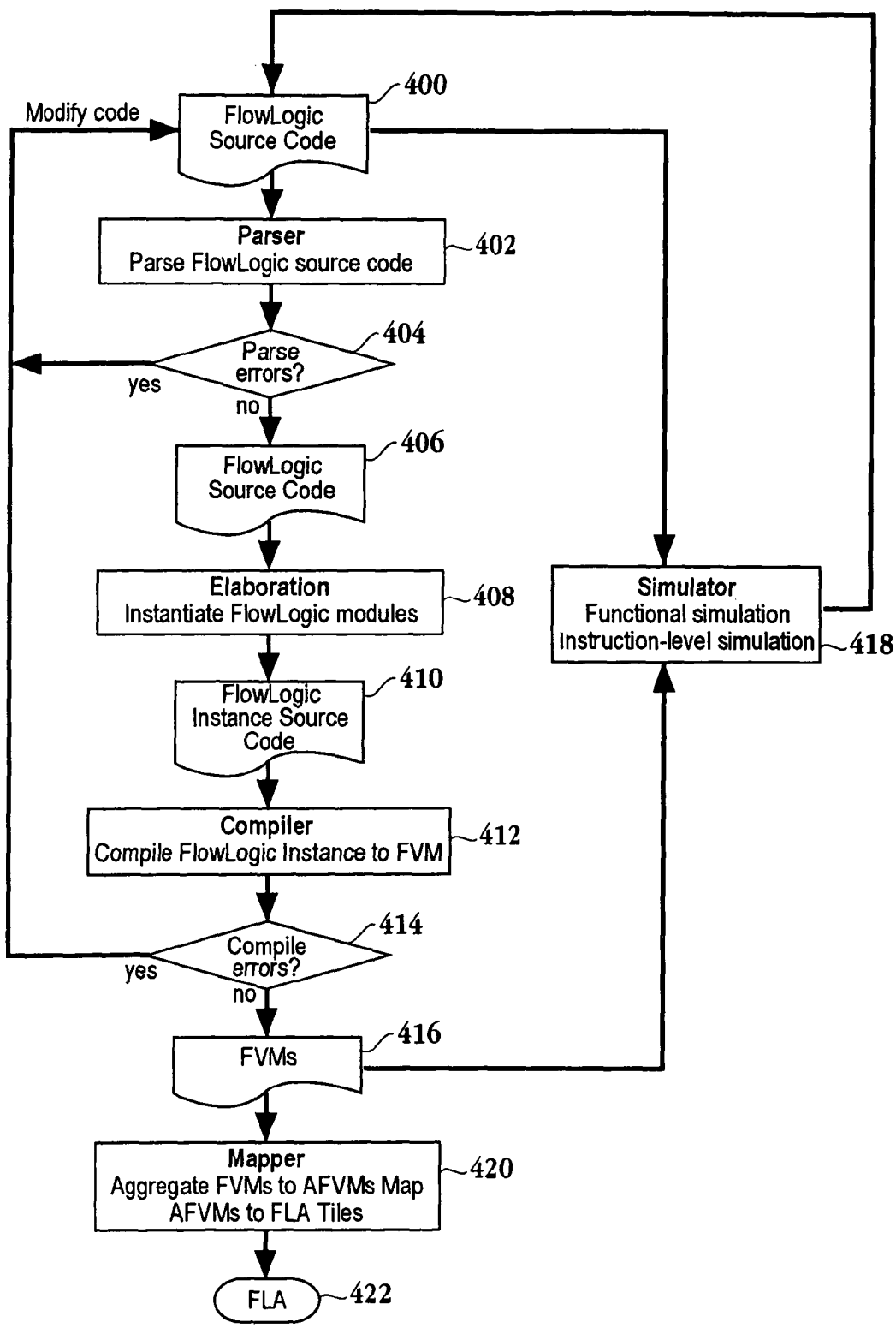
FIG. 10 is a flowchart diagram illustrating the method operations for configuring and programming a semiconductor circuit device having a multiple level array of memory storage cells in accordance with one embodiment of the invention.

FIG. 10 is a flowchart diagram illustrating the method operations for configuring and programming a semiconductor circuit device having a multiple level array of memory storage cells in accordance with one embodiment of the invention. The method initiates with operation 400 where the initial FlowLogic source code is provided. In operation 402, the FlowLogic source code is parsed. In decision operation 404, it is determined whether any errors exist in the source code, e.g., syntax errors. Since FlowLogic supports a subset of C++ in one embodiment, it should be appreciated that this check will reveal any syntax issues. If an error does exist, the method returns to operation 400 and the error is corrected and the method resumes as described above. If there is no error detected, then the method advances to operation 406 where the FlowLogic source code is in a state where some of the code is in a C++ format. In operation 408, the Flowlogic modules are instantiated through an elaboration process. Here, the source code having a description of a network is converted to code representing FlowLogic instances, i.e., a network of instances is provided. This results in the FlowLogic Instance source code as represented in operation 410.

Still referring to FIG. 10, in operation 412, the FlowLogic Instances are compiled into corresponding FVMs. The compiled FVMs are checked for compile errors in operation 414. If there are compile errors found in operation 414, then the method returns to operation 400 and repeats as described above. If there are no compile errors, then the compiled FVMs are made available in operation 416. The compiled FVMs are input into a simulator in operation 418, wherein a functional simulation and an instruction level simulation are performed. It should be appreciated that the source code from operation 400 is used to provide the function level simulation, while the compiled FVMs are used to provide the instructional level simulation. In operation 420, a mapper aggregates the FVMs to AFVMs and maps AFVMs to FLA (FlowLogicArray) Tiles. Here, the mapping of the AFVM is into a portion of the multiple level array of memory storage cells. Additionally, the multi-way access paths of the multiple level array are configured according to the multiple FVMs in operation 420. Thereafter, the portion of the multiple level array is programmed to function according to the multiple FVMs. The method terminates in operation 422 where the FLA (FlowLogicArray) is defined as a chip in silicon.

The invention has been described herein in terms of several exemplary embodiments. Other embodiments of the invention will be apparent to those skilled in the art from consideration of the specification and practice of the invention. The embodiments and preferred features described above should be considered exemplary, with the invention being defined by the appended claims.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data which can be thereafter be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer systems so that the computer readable code is stored and executed in a distributed fashion.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. A method for specifying stateful, transaction-oriented systems for configuring one of a programmable hardware array or programmable processor array through a FlowLogic language, comprising method operations of:

designating a plurality of primitive FlowModules;

defining at least one FlowGate within each of the plurality of FlowModules, wherein each FlowGate includes a non-interuptable sequence of procedure code, a single point of entry and is invoked by a named concurrent call;

encapsulating one of the primitive FlowModules or a HierarchicalFlowModule into another HierarchicalFlowModule, wherein the another HierarchicalFlowModule includes input ports for every intersected incoming arc and output ports for every intersected outgoing arc;

designating an Arc from a calling FlowGate to a called FlowGate, the designating including designating an Arc pair as a CallForwardArc and a ForwardArc, wherein the ForwardArc does not have an explicit destination FlowGate name on invocation, and the CallForwardArc explicitly specifies the destination FlowGate of the resulting ForwardArc;

generating a Signal for each named invocation of the called FlowGate;

defining a Channel for carrying the Signal; and compiling the HierarchicalFlowModule for configuring one of the programmable hardware array or the programmable processor array.

2. The method of claim 1 wherein each FlowGate includes local state variables and each FlowGate has a short lifetime.

3. The method of claim 1, wherein each FlowGate does not include any dynamically allocated heap variables and has no post termination state.

4. The method of claim 1, wherein each FlowGate is capable of being executed concurrently with other FlowGates of other primitive FlowModules.

5. The method of claim 1, wherein each FlowGate is enabled to make concurrent calls to other FlowGates and itself.

6. The method of claim 1, wherein only one FlowGate executes at a time per primitive FlowModule.

7. The method of claim 1, wherein the Signal is delivered asynchronously to the called FlowGate on a first in first out basis.

8. The method of claim 1, wherein Signals generated by multiple source FlowGates for one of a same destination FlowGate or a different destination FlowGate within the same FlowModule are associated with a non-deterministic order.

9. The method of claim 1, further comprising:
classifying the Signal into a class; and
assigning each class to a different Channel.

10. The method of claim 9, wherein classifying the Signal includes,
assigning priorities to the Signal, wherein a Channel having higher priority Signal is assigned more resources.

11. The method of claim 1, wherein each Signal addresses the called FlowGate and has a variable size.

12. The method of claim 1, wherein the Primitive FlowModule is an object containing an object oriented FlowMethod.

13. The method of claim 12, wherein the object oriented FlowMethod is invoked by one of FlowGates or a FlowMethod within a same FlowModule.

14. The method of claim 13, wherein the FlowMethod is unable to call itself and wherein the FlowMethod has no post-termination persistent states.

15. The method of claim 12, wherein local state variables last a lifetime of the FlowMethod.

16. The method of claim 12, wherein there does not exist any dynamically allocated heap local variables.

17. The method of claim 12, wherein a sequence of procedural code is non-interruptable.

18. The method of claim 1, wherein each of the primitive FlowModules includes a set of static variables defining possible states.

19. The method of claim 18, wherein the possible states are accessible by one of the at least one FlowGate or a FlowMethod of the FlowModule.

20. The method of claim 1 further comprising:
designating a destination DynamicFlowGate, the destination DynamicFlowGate enabling a source FlowGate to supply execution code for a destination FlowGate.

21. The method of claim 1, further comprising
designating a FlowTunnel, wherein the sub-design, and is associated with a larger FlowLogic Design, with two or more Clusters, the Clusters exchanging specially attributed Signals routed through the FlowTunnel.

22. The method of claim 21, wherein the FlowTunnel enables abstract mapping of an underlying physical communications layer.

23. The method of claim 21, wherein the clusters are compiled into sequential code for mapping into uniprocessor subsystems, which includes driver software running on a host machine.

24. A method for specifying stateful, transaction-oriented systems for configuring one of a programmable hardware array or programmable processor array through a FlowLogic language, comprising method operations of:

designating a plurality of primitive FlowModules;

defining at least one FlowGate within each of the plurality of FlowModules, wherein each FlowGate includes a non-interruptable sequence of procedure code, a single point of entry and is invoked by a named concurrent call;

designating an Arc from a calling FlowGate to a called FlowGate generating a Signal for each named invocation of the called FlowGate, the designating the Arc and generating the Signal including,
designating a TimedArc from the calling FlowGate to the called FlowGate;
carrying a TimerSignal in a TimerChannel; and,
delivering the TimerSignal in an order of time expiration relative to other TimerSignals, the designating including designating an Arc pair as a CallForwardArc and a ForwardArc, wherein the ForwardArc does not have an explicit destination FlowGate name on invocation, and the CallForwardArc explicitly specifies the destination FlowGate of the resulting ForwardArc;

defining a Channel for carrying the Signal; and compiling the FlowModules for configuring one of the programmable hardware array or the programmable processor array.

25. A method for specifying stateful, transaction-oriented systems for configuring one of a programmable hardware array or programmable processor array through a FlowLogic language, comprising method operations of:

designating a plurality of primitive FlowModules;

defining at least one FlowGate within each of the plurality of FlowModules, wherein each FlowGate includes a non-interuptable sequence of procedure code, a single point of entry and is invoked by a named concurrent call;

designating an Arc from a calling FlowGate to a called FlowGate, the designating including,
    designating an Arc pair as a CallForwardArc and a ForwardArc, wherein the ForwardArc does not have an explicit destination FlowGate name on invocation, and the CallForwardArc explicitly specifies the destination FlowGate of the resulting ForwardArc;
    generating a Signal for each named invocation of the called FlowGate;

defining a Channel for carrying the Signal; and compiling the FlowModules for configuring one of the programmable hardware array or the programmable processor array.

* * * * *